United States Patent
Yin et al.

(10) Patent No.: US 8,932,514 B1
(45) Date of Patent: Jan. 13, 2015

(54) FRACTURE TOUGHNESS OF GLASS

(75) Inventors: Qinghua Yin, Tempe, AZ (US); Xiwang Qi, Scottsdale, AZ (US); Maximilian A. Biberger, Scottsdale, AZ (US); David Leamon, Gilbert, AZ (US)

(73) Assignee: SDCmaterials, Inc., Tempe, AZ (US)

( * ) Notice: Subject to any disclaimer, the term of this patent is extended or adjusted under 35 U.S.C. 154(b) by 489 days.

(21) Appl. No.: 12/962,523

(22) Filed: Dec. 7, 2010

Related U.S. Application Data

(60) Provisional application No. 61/284,329, filed on Dec. 15, 2009.

(51) Int. Cl.
*B28B 3/02* (2006.01)

(52) U.S. Cl.
CPC ..................... *B28B 3/025* (2013.01)
USPC ...................................... 264/603

(58) Field of Classification Search
CPC ...................................... B28B 3/025
See application file for complete search history.

(56) References Cited

U.S. PATENT DOCUMENTS

| | | | |
|---|---|---|---|
| 2,021,936 A | 11/1935 | Johnstone | |
| 2,284,554 A | 5/1942 | Beyerstedt | |
| 2,419,042 A | 4/1947 | Todd | 202/205 |
| 2,519,531 A | 8/1950 | Worn | 230/95 |
| 2,562,753 A | 7/1951 | Trost | 241/39 |
| 2,689,780 A | 9/1954 | Rice | 23/106 |
| 3,001,402 A | 9/1961 | Koblin | 73/421.5 |
| 3,042,511 A | 7/1962 | Reding, Jr. | |
| 3,067,025 A | 12/1962 | Chisholm | 75/84.5 |
| 3,145,287 A | 8/1964 | Siebein et al. | |

(Continued)

FOREIGN PATENT DOCUMENTS

| | | |
|---|---|---|
| DE | 34 45 273 A1 | 6/1986 |
| EP | 0 385 742 A1 | 9/1990 |

(Continued)

OTHER PUBLICATIONS

Y. Ji, J.A. Yeomans, Processing and mechanical properties of Al2O3-5 vol.% Cr nanocomposites, Journal of the European Ceramic Society, vol. 22, Issue 12, Nov. 2002, pp. 1927-1936.*

(Continued)

*Primary Examiner* — Joseph S Del Sole
*Assistant Examiner* — Russell Kemmerle, III
(74) *Attorney, Agent, or Firm* — Morrison & Foerster LLP

(57) ABSTRACT

A method of making glass is provided. The method comprises preparing a dispersion of a nano-material. A slurry of a glass matrix material is prepared. The nano-dispersion is mixed with the matrix slurry to form a nano-dispersion/slurry mixture. The nano-dispersion/slurry mixture is dried. The nano-dispersion/slurry mixture is pressed into a final manufacture comprising a molecular structure including the nano-material bonded within and uniformly distributed throughout the molecular structure. The manufacture comprises an increased fracture toughness compared with a conventional manufacture produced without bonding the nano-material within the molecular structure. The nano-material has a size on the order of tens of nanometers. The matrix material has a size on the order of several micrometers. Five percent of the nano-dispersion/slurry mixture comprises the nano-material dispersion. Sintering is performed on the final form using a sintering process following the pressing step. The sintering process includes a hot isostatic pressing process.

26 Claims, 2 Drawing Sheets

(56) References Cited

U.S. PATENT DOCUMENTS

| | | | |
|---|---|---|---|
| 3,178,121 A | 4/1965 | Wallace, Jr. .................. 241/5 |
| 3,179,782 A | 4/1965 | Matvay |
| 3,181,947 A | 5/1965 | Vordahl |
| 3,235,700 A | 2/1966 | Mondain-Monval et al. |
| 3,313,908 A | 4/1967 | Unger et al. |
| 3,401,465 A | 9/1968 | Larwill .......................... 34/57 |
| 3,450,926 A | 6/1969 | Kiernan |
| 3,457,788 A | 7/1969 | Miyajima ..................... 73/422 |
| 3,537,513 A | 11/1970 | Austin ......................... 165/70 |
| 3,552,653 A | 1/1971 | Inoue |
| 3,617,358 A | 11/1971 | Dittrich |
| 3,667,111 A | 6/1972 | Chartet |
| 3,741,001 A | 6/1973 | Fletcher et al. ............... 73/28 |
| 3,752,172 A | 8/1973 | Cohen et al. ................. 137/12 |
| 3,761,360 A | 9/1973 | Auvil et al. |
| 3,774,442 A | 11/1973 | Gustavsson .................. 73/28 |
| 3,804,034 A | 4/1974 | Stiglich, Jr. |
| 3,830,756 A | 8/1974 | Sanchez et al. .............. 252/462 |
| 3,871,448 A | 3/1975 | Vann et al. |
| 3,892,882 A | 7/1975 | Guest et al. .................. 427/34 |
| 3,914,573 A | 10/1975 | Muehlberger ................. 219/76 |
| 3,959,094 A | 5/1976 | Steinberg |
| 3,959,420 A | 5/1976 | Geddes et al. ............... 261/112 |
| 3,969,482 A | 7/1976 | Teller |
| 4,008,620 A | 2/1977 | Narato et al. ............. 73/421.5 A |
| 4,018,388 A | 4/1977 | Andrews ...................... 241/39 |
| 4,021,021 A | 5/1977 | Hall et al. |
| 4,127,760 A | 11/1978 | Meyer et al. |
| 4,139,497 A | 2/1979 | Castor et al. ................ 252/470 |
| 4,146,654 A | 3/1979 | Guyonnet |
| 4,157,316 A | 6/1979 | Thompson et al. ........... 252/462 |
| 4,171,288 A | 10/1979 | Keith et al. .................. 252/462 |
| 4,174,298 A | 11/1979 | Antos .......................... 252/441 |
| 4,189,925 A | 2/1980 | Long |
| 4,227,928 A | 10/1980 | Wang |
| 4,248,387 A | 2/1981 | Andrews ...................... 241/5 |
| 4,253,917 A | 3/1981 | Wang |
| 4,260,649 A | 4/1981 | Dension et al. |
| 4,284,609 A | 8/1981 | deVries ....................... 423/242 |
| 4,315,874 A | 2/1982 | Ushida et al. |
| 4,326,492 A | 4/1982 | Leibrand, Sr. et al. |
| 4,344,779 A | 8/1982 | Isserlis |
| 4,369,167 A | 1/1983 | Weir |
| 4,388,274 A | 6/1983 | Rourke et al. ............... 422/177 |
| 4,419,331 A | 12/1983 | Montalvo |
| 4,431,750 A | 2/1984 | McGinnis et al. ............. 502/329 |
| 4,436,075 A | 3/1984 | Campbell et al. ............. 123/557 |
| 4,440,733 A | 4/1984 | Lawson et al. |
| 4,458,138 A | 7/1984 | Adrian et al. |
| 4,459,327 A | 7/1984 | Wang |
| 4,505,945 A | 3/1985 | Dubust et al. |
| 4,506,136 A | 3/1985 | Smyth et al. |
| 4,513,149 A | 4/1985 | Gray et al. ................... 564/449 |
| 4,523,981 A | 6/1985 | Ang et al. |
| 4,545,872 A | 10/1985 | Sammells et al. |
| RE32,244 E | 9/1986 | Andersen |
| 4,609,441 A | 9/1986 | Frese, Jr. et al. |
| 4,610,857 A | 9/1986 | Ogawa et al. |
| 4,616,779 A | 10/1986 | Serrano et al. |
| 4,723,589 A | 2/1988 | Iyer et al. |
| 4,731,517 A | 3/1988 | Cheney |
| 4,751,021 A | 6/1988 | Mollon et al. |
| 4,764,283 A | 8/1988 | Ashbrook et al. ............ 210/695 |
| 4,765,805 A | 8/1988 | Wahl et al. |
| 4,824,624 A | 4/1989 | Palicka et al. ................ 264/67 |
| 4,836,084 A | 6/1989 | Vogelesang et al. |
| 4,855,505 A | 8/1989 | Koll ............................. 564/398 |
| 4,866,240 A | 9/1989 | Webber ..................... 219/121.47 |
| 4,877,937 A | 10/1989 | Müller |
| 4,885,038 A | 12/1989 | Anderson et al. |
| 4,921,586 A | 5/1990 | Molter |
| 4,970,364 A | 11/1990 | Müller |
| 4,982,050 A | 1/1991 | Gammie et al. |
| 4,983,555 A | 1/1991 | Roy et al. .................... 501/120 |
| 4,987,033 A | 1/1991 | Abkowitz et al. ............ 428/469 |
| 5,006,163 A | 4/1991 | Benn et al. |
| 5,015,863 A | 5/1991 | Takeshima et al. |
| 5,041,713 A | 8/1991 | Weidman ................. 219/121.51 |
| 5,043,548 A | 8/1991 | Whitney et al. ........... 219/121.84 |
| 5,070,064 A | 12/1991 | Hsu et al. |
| 5,073,193 A | 12/1991 | Chaklader et al. ............ 75/346 |
| 5,133,190 A | 7/1992 | Abdelmalek |
| 5,151,296 A | 9/1992 | Tokunaga |
| 5,157,007 A | 10/1992 | Domesle et al. .............. 502/66 |
| 5,192,130 A | 3/1993 | Endo et al. |
| 5,217,746 A | 6/1993 | Lenling et al. |
| 5,230,844 A | 7/1993 | Macaire et al. |
| 5,233,153 A | 8/1993 | Coats |
| 5,269,848 A | 12/1993 | Nakagawa |
| 5,294,242 A | 3/1994 | Zurecki et al. |
| 5,330,945 A | 7/1994 | Beckmeyer et al. |
| 5,338,716 A | 8/1994 | Triplett et al. |
| 5,369,241 A | 11/1994 | Taylor et al. ............. 219/121.47 |
| 5,371,049 A | 12/1994 | Moffett et al. ................ 501/89 |
| 5,372,629 A | 12/1994 | Anderson et al. ............. 75/332 |
| 5,392,797 A | 2/1995 | Welch ......................... 134/108 |
| 5,436,080 A | 7/1995 | Inoue et al. |
| 5,439,865 A | 8/1995 | Abe et al. ..................... 502/333 |
| 5,442,153 A | 8/1995 | Marantz et al. ........... 219/121.47 |
| 5,452,854 A | 9/1995 | Keller |
| 5,460,701 A | 10/1995 | Parker et al. |
| 5,464,458 A | 11/1995 | Yamamoto |
| 5,485,941 A | 1/1996 | Guyomard et al. ............ 222/1 |
| 5,486,675 A | 1/1996 | Taylor et al. |
| 5,534,149 A | 7/1996 | Birkenbeil et al. ............ 210/636 |
| 5,534,270 A | 7/1996 | De Castro |
| 5,543,173 A | 8/1996 | Horn, Jr. et al. |
| 5,553,507 A | 9/1996 | Basch et al. ................ 73/863.01 |
| 5,558,771 A | 9/1996 | Hagen et al. |
| 5,562,966 A | 10/1996 | Clarke et al. |
| 5,582,807 A | 12/1996 | Liao et al. |
| 5,596,973 A | 1/1997 | Grice |
| 5,611,896 A | 3/1997 | Swanepoel et al. ............ 204/169 |
| 5,630,322 A | 5/1997 | Heilmann et al. .............. 62/95 |
| 5,652,304 A | 7/1997 | Calderon et al. |
| 5,714,644 A | 2/1998 | Irgang et al. |
| 5,723,027 A | 3/1998 | Serole |
| 5,723,187 A | 3/1998 | Popoola et al. |
| 5,726,414 A | 3/1998 | Kitahashi et al. |
| 5,733,662 A | 3/1998 | Bogachek |
| 5,749,938 A | 5/1998 | Coombs ....................... 75/332 |
| 5,776,359 A | 7/1998 | Schultz et al. ............... 252/62.51 |
| 5,788,738 A | 8/1998 | Pirzada et al. ................ 75/331 |
| 5,804,155 A | 9/1998 | Farrauto et al. |
| 5,811,187 A | 9/1998 | Anderson et al. ............. 428/403 |
| 5,837,959 A | 11/1998 | Muehlberger et al. ... 219/121.47 |
| 5,851,507 A | 12/1998 | Pirzada et al. ................ 423/659 |
| 5,853,815 A | 12/1998 | Muehlberger ................ 427/446 |
| 5,858,470 A | 1/1999 | Bernecki et al. |
| 5,884,473 A | 3/1999 | Noda et al. |
| 5,905,000 A | 5/1999 | Yadav et al. ................... 429/33 |
| 5,928,806 A | 7/1999 | Olah et al. |
| 5,935,293 A | 8/1999 | Detering et al. .............. 75/10.29 |
| 5,973,289 A | 10/1999 | Read et al. |
| 5,989,648 A | 11/1999 | Phillips ........................ 427/456 |
| 5,993,967 A | 11/1999 | Brotzman, Jr. et al. ........ 428/407 |
| 5,993,988 A | 11/1999 | Ohara et al. ................... 429/40 |
| 6,004,620 A | 12/1999 | Camm |
| 6,012,647 A | 1/2000 | Ruta et al. .................. 239/132.1 |
| 6,033,781 A | 3/2000 | Brotzman, Jr. et al. ........ 428/405 |
| 6,045,765 A | 4/2000 | Nakatsuji et al. |
| 6,059,853 A | 5/2000 | Coombs ....................... 75/332 |
| 6,066,587 A | 5/2000 | Kurokawa et al. |
| 6,084,197 A | 7/2000 | Fusaro, Jr. |
| 6,093,306 A | 7/2000 | Hanrahan et al. |
| 6,093,378 A | 7/2000 | Deeba et al. |
| 6,102,106 A | 8/2000 | Manning et al. ............... 165/76 |
| 6,117,376 A | 9/2000 | Merkel |
| 6,140,539 A | 10/2000 | Sander et al. |
| 6,168,694 B1 | 1/2001 | Huang et al. |
| 6,190,627 B1 | 2/2001 | Hoke et al. |
| 6,213,049 B1 | 4/2001 | Yang ............................ 118/723 |
| 6,214,195 B1 | 4/2001 | Yadav et al. .................. 205/334 |
| 6,228,904 B1 | 5/2001 | Yadav et al. .................. 523/210 |

(56) References Cited

U.S. PATENT DOCUMENTS

| | | | |
|---|---|---|---|
| 6,254,940 B1 | 7/2001 | Pratsinis et al. | 427/562 |
| 6,261,484 B1 | 7/2001 | Phillips et al. | 264/5 |
| 6,267,864 B1 | 7/2001 | Yadav et al. | 205/341 |
| 6,322,756 B1 | 11/2001 | Arno et al. | |
| 6,342,465 B1 | 1/2002 | Klein et al. | 502/339 |
| 6,344,271 B1 | 2/2002 | Yadav et al. | 428/402 |
| 6,362,449 B1 | 3/2002 | Hadidi et al. | |
| 6,379,419 B1 | 4/2002 | Celik et al. | 75/346 |
| 6,387,560 B1 | 5/2002 | Yadav et al. | 429/45 |
| 6,395,214 B1 | 5/2002 | Kear et al. | 264/434 |
| 6,398,843 B1 | 6/2002 | Tarrant | 75/249 |
| 6,399,030 B1 | 6/2002 | Nolan | |
| 6,409,851 B1 | 6/2002 | Sethuram et al. | 148/565 |
| 6,413,781 B1 | 7/2002 | Geis et al. | 436/178 |
| 6,416,818 B1 | 7/2002 | Aikens et al. | 427/383.1 |
| RE37,853 E | 9/2002 | Detering et al. | 75/10.19 |
| 6,444,009 B1 | 9/2002 | Liu et al. | 75/332 |
| 6,475,951 B1 | 11/2002 | Domesle et al. | |
| 6,488,904 B1 | 12/2002 | Cox et al. | |
| 6,506,995 B1 | 1/2003 | Fusaro, Jr. et al. | |
| 6,517,800 B1 | 2/2003 | Cheng et al. | 423/447.1 |
| 6,524,662 B2 | 2/2003 | Jang et al. | 427/535 |
| 6,531,704 B2 | 3/2003 | Yadav et al. | 250/493.1 |
| 6,548,445 B1 | 4/2003 | Buysch et al. | 502/230 |
| 6,554,609 B2 | 4/2003 | Yadav et al. | 432/9 |
| 6,562,304 B1 | 5/2003 | Mizrahi | |
| 6,562,495 B2 | 5/2003 | Yadav et al. | 429/12 |
| 6,569,393 B1 | 5/2003 | Hoke et al. | |
| 6,569,397 B1 | 5/2003 | Yadav et al. | 423/345 |
| 6,569,518 B2 | 5/2003 | Yadav et al. | 428/323 |
| 6,572,672 B2 | 6/2003 | Yadav et al. | 75/343 |
| 6,579,446 B1 | 6/2003 | Teran et al. | |
| 6,596,187 B2 | 7/2003 | Coll et al. | 216/56 |
| 6,603,038 B1 | 8/2003 | Hagemeyer et al. | 560/241.1 |
| 6,607,821 B2 | 8/2003 | Yadav et al. | 428/323 |
| 6,610,355 B2 | 8/2003 | Yadav et al. | 427/115 |
| 6,623,559 B2 | 9/2003 | Huang | 117/87 |
| 6,635,357 B2 | 10/2003 | Moxson et al. | 428/548 |
| 6,641,775 B2 | 11/2003 | Vigliotti et al. | 264/618 |
| 6,652,822 B2 | 11/2003 | Phillips et al. | 423/290 |
| 6,652,967 B2 | 11/2003 | Yadav et al. | 428/403 |
| 6,669,823 B1 | 12/2003 | Sarkas et al. | 204/164 |
| 6,682,002 B2 | 1/2004 | Kyotani | 239/318 |
| 6,689,192 B1 | 2/2004 | Phillips et al. | 75/342 |
| 6,699,398 B1 | 3/2004 | Kim | 216/55 |
| 6,706,097 B2 | 3/2004 | Zornes | 96/153 |
| 6,706,660 B2 | 3/2004 | Park | |
| 6,710,207 B2 | 3/2004 | Bogan, Jr. et al. | 562/549 |
| 6,713,176 B2 | 3/2004 | Yadav et al. | 428/402 |
| 6,716,525 B1 | 4/2004 | Yadav et al. | 428/402 |
| 6,744,006 B2 | 6/2004 | Johnson et al. | |
| 6,746,791 B2 | 6/2004 | Yadav et al. | 429/30 |
| 6,772,584 B2 | 8/2004 | Chun et al. | 60/275 |
| 6,786,950 B2 | 9/2004 | Yadav et al. | 75/346 |
| 6,813,931 B2 | 11/2004 | Yadav et al. | 73/31.05 |
| 6,817,388 B2 | 11/2004 | Tsangaris et al. | 141/82 |
| 6,832,735 B2 | 12/2004 | Yadav et al. | 241/16 |
| 6,838,072 B1 | 1/2005 | Kong et al. | 423/594.2 |
| 6,841,509 B1 | 1/2005 | Hwang et al. | |
| 6,855,410 B2 | 2/2005 | Buckley | |
| 6,855,426 B2 * | 2/2005 | Yadav | 428/403 |
| 6,855,749 B1 | 2/2005 | Yadav et al. | 523/105 |
| 6,858,170 B2 | 2/2005 | Van Thillo et al. | |
| 6,886,545 B1 | 5/2005 | Holm | 123/568.21 |
| 6,891,319 B2 | 5/2005 | Dean et al. | |
| 6,896,958 B1 | 5/2005 | Cayton et al. | 428/323 |
| 6,902,699 B2 | 6/2005 | Fritzemeier et al. | 419/38 |
| 6,916,872 B2 | 7/2005 | Yadav et al. | 524/430 |
| 6,919,065 B2 | 7/2005 | Zhou et al. | |
| 6,919,527 B2 | 7/2005 | Boulos et al. | 219/121.52 |
| 6,933,331 B2 | 8/2005 | Yadav et al. | 523/210 |
| 6,972,115 B1 | 12/2005 | Ballard | |
| 6,986,877 B2 | 1/2006 | Takikawa et al. | 423/447.3 |
| 6,994,837 B2 | 2/2006 | Boulos et al. | 423/613 |
| 7,007,872 B2 | 3/2006 | Yadav et al. | 241/1 |
| 7,022,305 B2 | 4/2006 | Drumm et al. | |
| 7,052,777 B2 | 5/2006 | Brotzman, Jr. et al. | 428/570 |
| 7,073,559 B2 | 7/2006 | O'Larey et al. | 164/76.1 |
| 7,074,364 B2 | 7/2006 | Jähn et al. | |
| 7,081,267 B2 | 7/2006 | Yadav | 427/115 |
| 7,101,819 B2 | 9/2006 | Rosenflanz et al. | 501/10 |
| 7,147,544 B2 | 12/2006 | Rosenflanz | 451/28 |
| 7,147,894 B2 | 12/2006 | Zhou et al. | 427/256 |
| 7,166,198 B2 | 1/2007 | Van Der Walt et al. | 204/165 |
| 7,166,663 B2 | 1/2007 | Cayton et al. | 524/430 |
| 7,172,649 B2 | 2/2007 | Conrad et al. | 106/35 |
| 7,172,790 B2 | 2/2007 | Koulik et al. | |
| 7,178,747 B2 | 2/2007 | Yadav et al. | 241/23 |
| 7,208,126 B2 | 4/2007 | Musick et al. | 423/69 |
| 7,211,236 B2 | 5/2007 | Stark et al. | 423/592.1 |
| 7,217,407 B2 | 5/2007 | Zhang | 423/610 |
| 7,220,398 B2 | 5/2007 | Sutorik et al. | 423/593.1 |
| 7,255,498 B2 | 8/2007 | Bush et al. | |
| 7,265,076 B2 | 9/2007 | Taguchi et al. | |
| 7,282,167 B2 | 10/2007 | Carpenter | |
| 7,307,195 B2 | 12/2007 | Polverejan et al. | 585/443 |
| 7,323,655 B2 | 1/2008 | Kim | 219/121.43 |
| 7,384,447 B2 | 6/2008 | Kodas et al. | 75/332 |
| 7,402,899 B1 | 7/2008 | Whiting et al. | |
| 7,417,008 B2 | 8/2008 | Richards et al. | 502/306 |
| 7,494,527 B2 | 2/2009 | Jurewicz et al. | 75/346 |
| 7,517,826 B2 | 4/2009 | Fujdala et al. | |
| 7,534,738 B2 | 5/2009 | Fujdala et al. | |
| 7,541,012 B2 | 6/2009 | Yeung et al. | 423/245.1 |
| 7,541,310 B2 | 6/2009 | Espinoza et al. | |
| 7,557,324 B2 | 7/2009 | Nylen et al. | |
| 7,572,315 B2 | 8/2009 | Boulos et al. | 75/336 |
| 7,576,029 B2 | 8/2009 | Saito et al. | |
| 7,576,031 B2 | 8/2009 | Beutel et al. | |
| 7,604,843 B1 | 10/2009 | Robinson et al. | |
| 7,611,686 B2 | 11/2009 | Alekseeva et al. | 423/276 |
| 7,615,097 B2 | 11/2009 | McKechnie et al. | 75/346 |
| 7,618,919 B2 | 11/2009 | Shimazu et al. | |
| 7,622,693 B2 | 11/2009 | Foret | 219/121.43 |
| 7,632,775 B2 | 12/2009 | Zhou et al. | |
| 7,635,218 B1 | 12/2009 | Lott | |
| 7,674,744 B2 | 3/2010 | Shiratori et al. | |
| 7,678,419 B2 | 3/2010 | Kevwitch et al. | |
| 7,704,369 B2 | 4/2010 | Olah et al. | |
| 7,709,411 B2 | 5/2010 | Zhou et al. | |
| 7,709,414 B2 | 5/2010 | Fujdala et al. | |
| 7,745,367 B2 | 6/2010 | Fujdala et al. | |
| 7,750,265 B2 | 7/2010 | Belashchenko et al. | |
| 7,759,279 B2 | 7/2010 | Shiratori et al. | |
| 7,759,281 B2 | 7/2010 | Kezuka et al. | |
| 7,803,210 B2 | 9/2010 | Sekine et al. | 75/334 |
| 7,842,515 B2 | 11/2010 | Zou et al. | |
| 7,851,405 B2 | 12/2010 | Wakamatsu et al. | |
| 7,874,239 B2 | 1/2011 | Howland | |
| 7,875,573 B2 | 1/2011 | Beutel et al. | |
| 7,897,127 B2 | 3/2011 | Layman et al. | |
| 7,902,104 B2 | 3/2011 | Kalck | |
| 7,905,942 B1 | 3/2011 | Layman | |
| 7,935,655 B2 | 5/2011 | Tolmachev | |
| 8,051,724 B1 | 11/2011 | Layman et al. | |
| 8,076,258 B1 | 12/2011 | Biberger | |
| 8,080,494 B2 | 12/2011 | Yasuda et al. | |
| 8,089,495 B2 | 1/2012 | Keller | |
| 8,129,654 B2 | 3/2012 | Lee et al. | |
| 8,142,619 B2 | 3/2012 | Layman et al. | |
| 8,168,561 B2 | 5/2012 | Virkar | |
| 8,173,572 B2 | 5/2012 | Feaviour | |
| 8,211,392 B2 | 7/2012 | Grubert et al. | |
| 8,258,070 B2 | 9/2012 | Fujdala et al. | |
| 8,278,240 B2 | 10/2012 | Tange et al. | |
| 8,294,060 B2 | 10/2012 | Mohanty et al. | |
| 8,309,489 B2 | 11/2012 | Cuenya et al. | |
| 8,349,761 B2 | 1/2013 | Xia et al. | |
| 8,404,611 B2 | 3/2013 | Nakamura et al. | |
| 8,524,631 B2 | 9/2013 | Biberger | |
| 8,557,727 B2 | 10/2013 | Yin et al. | |
| 8,574,408 B2 | 11/2013 | Layman | |
| 8,669,202 B2 | 3/2014 | Van Den Hoek et al. | |
| 2001/0004009 A1 | 6/2001 | MacKelvie | |

(56) References Cited

U.S. PATENT DOCUMENTS

| | | | |
|---|---|---|---|
| 2001/0042802 A1 | 11/2001 | Youds | 241/5 |
| 2001/0055554 A1 | 12/2001 | Hoke et al. | |
| 2002/0018815 A1 | 2/2002 | Sievers et al. | 424/489 |
| 2002/0068026 A1 | 6/2002 | Murrell et al. | 422/211 |
| 2002/0071800 A1 | 6/2002 | Hoke et al. | |
| 2002/0079620 A1 | 6/2002 | DuBuis et al. | 264/328.14 |
| 2002/0100751 A1 | 8/2002 | Carr | |
| 2002/0102674 A1 | 8/2002 | Anderson | 435/174 |
| 2002/0131914 A1 | 9/2002 | Sung | |
| 2002/0143417 A1 | 10/2002 | Ito et al. | 700/95 |
| 2002/0168466 A1 | 11/2002 | Tapphorn et al. | |
| 2002/0182735 A1 | 12/2002 | Kibby et al. | 436/37 |
| 2002/0183191 A1 | 12/2002 | Faber et al. | |
| 2002/0192129 A1 | 12/2002 | Shamouilian et al. | |
| 2003/0036786 A1 | 2/2003 | Duren et al. | 607/96 |
| 2003/0042232 A1 | 3/2003 | Shimazu | 219/121.47 |
| 2003/0047617 A1 | 3/2003 | Shanmugham et al. | |
| 2003/0066800 A1 | 4/2003 | Saim et al. | 264/5 |
| 2003/0102099 A1 | 6/2003 | Yadav et al. | |
| 2003/0108459 A1 | 6/2003 | Wu et al. | 422/186.04 |
| 2003/0110931 A1 | 6/2003 | Aghajanian et al. | |
| 2003/0129098 A1 | 7/2003 | Endo et al. | |
| 2003/0139288 A1 | 7/2003 | Cai et al. | 502/303 |
| 2003/0143153 A1 | 7/2003 | Boulos et al. | |
| 2003/0172772 A1 | 9/2003 | Sethuram et al. | 501/87 |
| 2003/0223546 A1 | 12/2003 | McGregor et al. | 378/143 |
| 2004/0009118 A1 | 1/2004 | Phillips et al. | 423/592.1 |
| 2004/0023302 A1 | 2/2004 | Archibald et al. | 435/7.1 |
| 2004/0023453 A1 | 2/2004 | Xu et al. | 257/369 |
| 2004/0077494 A1 | 4/2004 | LaBarge et al. | 502/303 |
| 2004/0103751 A1 | 6/2004 | Joseph et al. | 75/10.19 |
| 2004/0109523 A1 | 6/2004 | Singh et al. | |
| 2004/0119064 A1 | 6/2004 | Narayan et al. | |
| 2004/0127586 A1 | 7/2004 | Jin et al. | 518/715 |
| 2004/0129222 A1 | 7/2004 | Nylen et al. | |
| 2004/0166036 A1 | 8/2004 | Chen et al. | |
| 2004/0167009 A1 | 8/2004 | Kuntz et al. | 501/95.2 |
| 2004/0176246 A1 | 9/2004 | Shirk et al. | 502/439 |
| 2004/0208805 A1 | 10/2004 | Fincke et al. | |
| 2004/0213998 A1 | 10/2004 | Hearley et al. | 428/402 |
| 2004/0235657 A1 | 11/2004 | Xiao et al. | |
| 2004/0238345 A1 | 12/2004 | Koulik et al. | |
| 2004/0251017 A1 | 12/2004 | Pillion et al. | 165/289 |
| 2004/0251241 A1 | 12/2004 | Blutke et al. | |
| 2005/0000321 A1 | 1/2005 | O'Larey et al. | 75/952 |
| 2005/0000950 A1 | 1/2005 | Schroder et al. | 219/121.59 |
| 2005/0066805 A1 | 3/2005 | Park et al. | |
| 2005/0070431 A1 | 3/2005 | Alvin et al. | |
| 2005/0077034 A1 | 4/2005 | King | 165/163 |
| 2005/0097988 A1 | 5/2005 | Kodas et al. | 75/332 |
| 2005/0106865 A1 | 5/2005 | Chung et al. | |
| 2005/0133121 A1 | 6/2005 | Subramanian et al. | |
| 2005/0153069 A1 | 7/2005 | Tapphorn et al. | |
| 2005/0163673 A1 | 7/2005 | Johnson et al. | |
| 2005/0199739 A1 | 9/2005 | Kuroda et al. | 239/13 |
| 2005/0211018 A1 | 9/2005 | Jurewicz et al. | |
| 2005/0220695 A1 | 10/2005 | Abatzoglou et al. | 423/445 |
| 2005/0227864 A1 | 10/2005 | Sutorik et al. | |
| 2005/0233380 A1 | 10/2005 | Pesiri et al. | 435/7.1 |
| 2005/0240069 A1 | 10/2005 | Polverejan et al. | 585/444 |
| 2005/0258766 A1 | 11/2005 | Kim | 315/111.21 |
| 2005/0275143 A1 | 12/2005 | Toth | |
| 2006/0043651 A1 | 3/2006 | Yamamoto et al. | |
| 2006/0051505 A1 | 3/2006 | Kortshagen et al. | 427/212 |
| 2006/0068989 A1 | 3/2006 | Ninomiya et al. | 502/339 |
| 2006/0094595 A1 | 5/2006 | Labarge | 502/325 |
| 2006/0096393 A1 | 5/2006 | Pesiri | 73/863.21 |
| 2006/0105910 A1 | 5/2006 | Zhou et al. | 502/338 |
| 2006/0108332 A1 | 5/2006 | Belashchenko | 219/121.47 |
| 2006/0153728 A1 | 7/2006 | Schoenung et al. | 419/32 |
| 2006/0153765 A1 | 7/2006 | Pham-Huu et al. | 423/345 |
| 2006/0159596 A1 | 7/2006 | De La Veaux et al. | 422/151 |
| 2006/0166809 A1 | 7/2006 | Malek et al. | |
| 2006/0211569 A1 | 9/2006 | Dang et al. | |
| 2006/0213326 A1 | 9/2006 | Gollob et al. | |
| 2006/0222780 A1 | 10/2006 | Gurevich et al. | |
| 2006/0231525 A1 | 10/2006 | Asakawa et al. | 216/56 |
| 2007/0044513 A1 | 3/2007 | Kear et al. | |
| 2007/0048206 A1 | 3/2007 | Hung et al. | 423/335 |
| 2007/0049484 A1 | 3/2007 | Kear et al. | |
| 2007/0063364 A1 | 3/2007 | Hsiao et al. | 264/5 |
| 2007/0084308 A1 | 4/2007 | Nakamura et al. | 75/346 |
| 2007/0084834 A1 | 4/2007 | Hanus et al. | 219/121.5 |
| 2007/0087934 A1 | 4/2007 | Martens et al. | 502/214 |
| 2007/0092768 A1 | 4/2007 | Lee et al. | |
| 2007/0153390 A1 | 7/2007 | Nakamura et al. | |
| 2007/0163385 A1 | 7/2007 | Takahashi et al. | |
| 2007/0173403 A1 | 7/2007 | Koike et al. | 502/300 |
| 2007/0178673 A1 | 8/2007 | Gole et al. | |
| 2007/0221404 A1 | 9/2007 | Das et al. | |
| 2007/0253874 A1 | 11/2007 | Foret | 422/186.07 |
| 2007/0292321 A1 | 12/2007 | Plischke et al. | 422/198 |
| 2008/0006954 A1 | 1/2008 | Yubuta et al. | |
| 2008/0026041 A1 | 1/2008 | Tepper et al. | |
| 2008/0031806 A1 | 2/2008 | Gavenonis et al. | 423/608 |
| 2008/0038578 A1 | 2/2008 | Li | |
| 2008/0045405 A1 | 2/2008 | Beutel et al. | |
| 2008/0047261 A1 | 2/2008 | Han et al. | |
| 2008/0057212 A1 | 3/2008 | Dorier et al. | |
| 2008/0064769 A1 | 3/2008 | Sato et al. | |
| 2008/0104735 A1 | 5/2008 | Howland | |
| 2008/0105083 A1 | 5/2008 | Nakamura et al. | 75/255 |
| 2008/0116178 A1 | 5/2008 | Weidman | 219/121.47 |
| 2008/0125308 A1 | 5/2008 | Fujdala et al. | |
| 2008/0125313 A1 | 5/2008 | Fujdala et al. | |
| 2008/0138651 A1 | 6/2008 | Doi et al. | |
| 2008/0175936 A1 | 7/2008 | Tokita et al. | |
| 2008/0187714 A1 | 8/2008 | Wakamatsu et al. | |
| 2008/0206562 A1 | 8/2008 | Stucky et al. | |
| 2008/0207858 A1 | 8/2008 | Kowaleski et al. | |
| 2008/0248704 A1 | 10/2008 | Mathis et al. | |
| 2008/0274344 A1 | 11/2008 | Vieth et al. | 428/304.4 |
| 2008/0277092 A1 | 11/2008 | Layman et al. | 165/281 |
| 2008/0277264 A1 | 11/2008 | Biberger et al. | |
| 2008/0277266 A1 | 11/2008 | Layman et al. | 204/157.15 |
| 2008/0277267 A1 | 11/2008 | Biberger et al. | 204/157.15 |
| 2008/0277268 A1 | 11/2008 | Layman | 204/164 |
| 2008/0277269 A1 | 11/2008 | Layman et al. | 423/215.5 |
| 2008/0277270 A1 | 11/2008 | Biberger et al. | 204/164 |
| 2008/0277271 A1 | 11/2008 | Layman | 422/130 |
| 2008/0280049 A1 | 11/2008 | Kevwitch et al. | 427/243 |
| 2008/0280751 A1 | 11/2008 | Harutyunyan et al. | |
| 2008/0280756 A1 | 11/2008 | Biberger | 502/232 |
| 2008/0283411 A1 | 11/2008 | Eastman et al. | |
| 2008/0283498 A1 | 11/2008 | Yamazaki | |
| 2008/0307960 A1 | 12/2008 | Hendrickson et al. | |
| 2009/0010801 A1 | 1/2009 | Murphy et al. | 422/4 |
| 2009/0054230 A1 | 2/2009 | Veeraraghavan et al. | |
| 2009/0081092 A1 | 3/2009 | Yang et al. | |
| 2009/0088585 A1 | 4/2009 | Schammel et al. | 562/409 |
| 2009/0092887 A1 | 4/2009 | McGrath et al. | |
| 2009/0098402 A1 | 4/2009 | Kang et al. | |
| 2009/0114568 A1 | 5/2009 | Trevino et al. | 208/139 |
| 2009/0162991 A1 | 6/2009 | Beneyton et al. | |
| 2009/0168506 A1 | 7/2009 | Han et al. | |
| 2009/0170242 A1 | 7/2009 | Lin et al. | |
| 2009/0181474 A1 | 7/2009 | Nagai | |
| 2009/0200180 A1 | 8/2009 | Capote et al. | |
| 2009/0208367 A1 | 8/2009 | Calio et al. | |
| 2009/0209408 A1 | 8/2009 | Kitamura et al. | |
| 2009/0223410 A1 | 9/2009 | Jun et al. | |
| 2009/0253037 A1 | 10/2009 | Park et al. | |
| 2009/0274897 A1 | 11/2009 | Kaner et al. | |
| 2009/0274903 A1 | 11/2009 | Addiego | 428/337 |
| 2009/0286899 A1 | 11/2009 | Hofmann et al. | 522/99 |
| 2009/0324468 A1 | 12/2009 | Golden et al. | |
| 2010/0050868 A1 | 3/2010 | Kuznicki et al. | |
| 2010/0089002 A1 | 4/2010 | Merkel | |
| 2010/0092358 A1 | 4/2010 | Koegel et al. | |
| 2010/0124514 A1 | 5/2010 | Chelluri et al. | |
| 2010/0166629 A1 | 7/2010 | Deeba | |
| 2010/0180581 A1 | 7/2010 | Grubert et al. | |
| 2010/0180582 A1 | 7/2010 | Mueller-Stach et al. | |
| 2010/0186375 A1 | 7/2010 | Kazi et al. | |

(56) References Cited

U.S. PATENT DOCUMENTS

| | | |
|---|---|---|
| 2010/0240525 A1 | 9/2010 | Golden et al. |
| 2010/0275781 A1 | 11/2010 | Tsangaris |
| 2011/0006463 A1 | 1/2011 | Layman |
| 2011/0030346 A1 | 2/2011 | Neubauer et al. |
| 2011/0049045 A1 | 3/2011 | Hurt et al. |
| 2011/0052467 A1 | 3/2011 | Chase et al. |
| 2011/0143041 A1 | 6/2011 | Layman et al. |
| 2011/0143915 A1 | 6/2011 | Yin et al. |
| 2011/0143916 A1 | 6/2011 | Leamon |
| 2011/0143926 A1 | 6/2011 | Yin et al. |
| 2011/0143930 A1 | 6/2011 | Yin et al. |
| 2011/0143933 A1 | 6/2011 | Yin et al. |
| 2011/0144382 A1 | 6/2011 | Yin et al. |
| 2011/0152550 A1 | 6/2011 | Grey et al. |
| 2011/0158871 A1 | 6/2011 | Arnold et al. |
| 2011/0174604 A1 | 7/2011 | Duesel et al. |
| 2011/0243808 A1 | 10/2011 | Fossey et al. |
| 2011/0245073 A1 | 10/2011 | Oljaca et al. |
| 2011/0247336 A9 | 10/2011 | Farsad et al. |
| 2011/0305612 A1 | 12/2011 | Müller-Stach et al. |
| 2012/0023909 A1 | 2/2012 | Lambert et al. |
| 2012/0045373 A1 | 2/2012 | Biberger |
| 2012/0063963 A1 | 3/2012 | Watanabe et al. |
| 2012/0097033 A1 | 4/2012 | Arnold et al. |
| 2012/0122660 A1 | 5/2012 | Andersen et al. |
| 2012/0124974 A1 | 5/2012 | Li et al. |
| 2012/0171098 A1 | 7/2012 | Hung et al. |
| 2012/0308467 A1 | 12/2012 | Carpenter et al. |
| 2012/0313269 A1 | 12/2012 | Kear et al. |
| 2013/0079216 A1 | 3/2013 | Biberger et al. |
| 2013/0213018 A1 | 8/2013 | Yin et al. |
| 2013/0280528 A1 | 10/2013 | Biberger |
| 2013/0281288 A1 | 10/2013 | Biberger et al. |
| 2013/0316896 A1 | 11/2013 | Biberger |
| 2013/0345047 A1 | 12/2013 | Biberger et al. |
| 2014/0018230 A1 | 1/2014 | Yin et al. |
| 2014/0120355 A1 | 5/2014 | Biberger |
| 2014/0128245 A1 | 5/2014 | Yin et al. |
| 2014/0140909 A1 | 5/2014 | Qi et al. |
| 2014/0148331 A1 | 5/2014 | Biberger et al. |
| 2014/0209451 A1 | 7/2014 | Biberger et al. |

FOREIGN PATENT DOCUMENTS

| | | | | |
|---|---|---|---|---|
| EP | 1 134 302 A1 | 9/2001 | | |
| EP | 1 256 378 A2 | 11/2002 | | |
| EP | 1 619 168 A1 | 1/2006 | | |
| EP | 1 955 765 A1 | 8/2008 | | |
| GB | 1 307 941 A | 2/1973 | | |
| JP | 56-146804 | 11/1981 | ............... | B22F 9/08 |
| JP | 61-086815 A | 5/1986 | | |
| JP | 62-102827 A | 5/1987 | | |
| JP | 63-214342 A | 9/1988 | | |
| JP | 1-164795 A | 6/1989 | | |
| JP | 05-228361 A | 9/1993 | | |
| JP | 05-324094 A | 12/1993 | | |
| JP | 6-93309 A | 4/1994 | | |
| JP | 6-135797 A | 5/1994 | | |
| JP | 6-272012 A | 9/1994 | | |
| JP | H6-065772 U | 9/1994 | | |
| JP | 7031873 A | 2/1995 | | |
| JP | 07-256116 A | 10/1995 | | |
| JP | 8-158033 A | 6/1996 | | |
| JP | 8-215576 A | 8/1996 | | |
| JP | 10-130810 A | 5/1998 | | |
| JP | 10-249198 A | 9/1998 | | |
| JP | 11-502760 A | 3/1999 | | |
| JP | 2000-220978 A | 8/2000 | | |
| JP | 2002-88486 A | 3/2002 | | |
| JP | 2002-241812 A | 8/2002 | | |
| JP | 2002-336688 A | 11/2002 | | |
| JP | 2003-126694 A | 5/2003 | | |
| JP | 2004-233007 A | 8/2004 | | |
| JP | 2004-249206 A | 9/2004 | | |
| JP | 2004-290730 A | 10/2004 | | |
| JP | 2005-503250 A | 2/2005 | | |
| JP | 2005-122621 A | 5/2005 | | |
| JP | 2005-218937 A | 8/2005 | | |
| JP | 2005-342615 A | 12/2005 | | |
| JP | 2006-001779 A | 1/2006 | | |
| JP | 2006-508885 A | 3/2006 | | |
| JP | 2006-87965 A | 4/2006 | | |
| JP | 2006-247446 A | 9/2006 | | |
| JP | 2006-260385 A | 9/2006 | | |
| JP | 2006-326554 A | 12/2006 | | |
| JP | 2007-29859 A | 2/2007 | | |
| JP | 2007-44585 A | 2/2007 | | |
| JP | 2007-46162 A | 2/2007 | | |
| JP | 2007-203129 A | 8/2007 | | |
| SU | 493241 | 3/1976 | ............... | B01J 11/22 |
| TW | 200611449 | 4/2006 | | |
| TW | 201023207 | 6/2010 | | |
| WO | WO-96/28577 A1 | 9/1996 | | |
| WO | WO 02/092503 A1 | 11/2002 | ............ | C01B 21/064 |
| WO | WO-03/094195 A1 | 11/2003 | | |
| WO | WO 2004/052778 A2 | 6/2004 | ............. | C01B 13/28 |
| WO | WO-2005/063390 A1 | 7/2005 | | |
| WO | WO 2006/079213 A1 | 8/2006 | ................ | B01J 2/04 |
| WO | WO-2007/144447 A1 | 12/2007 | | |
| WO | WO-2008/130451 A2 | 10/2008 | | |
| WO | WO-2008/130451 A3 | 10/2008 | | |
| WO | WO-2009/017479 A1 | 2/2009 | | |
| WO | WO-2011/081833 A1 | 7/2011 | | |
| WO | WO-2012/028695 A2 | 3/2012 | | |
| WO | WO-2013/028575 A1 | 2/2013 | | |

OTHER PUBLICATIONS

N. Ünal, F. Kern, M.L. Öveǧlu, R. Gadow, Influence of WC particles on the microstructural and mechanical properties of 3 mol% Y2O3 stabilized ZrO2 matrix composites produced by hot pressing, Journal of the European Ceramic Society, vol. 31, Issue 13, Nov. 2011, pp. 2267-2275.*

Rahaman, R. A. Ceramic Processing and Sintering, New York. Marcel Decker, 1995. Pages 71-77.*

K. T. Faber, T. Iwagoshi, A. Ghosh, Toughening by Stress-Induced Microcracking in Two-Phase Ceramics, J. Am. Ceram. Soc, vol. 71, Issue 9, Sep. 1988, pp. C-399-C-401.*

A. Gutsch et al., "Gas-Phase Production of Nanoparticles", Kona No. 20, 2002, pp. 24-37.

Dr. Heike Mühlenweg et al., "Gas-Phase Reactions—Open Up New Roads to Nanoproducts", Degussa ScienceNewsletter No. 08, 2004 pp. 12-16.

Coating Generation: Vaporization of Particles in Plasma Spraying and Splat Formation, M. Vardelle, A. Vardelle, K-I Ii P. Fauchais, Universite de Limoges, 123 Avenue A. Thomas 87000, Limoges, F. , Pure & Chem, vol. 68, No. 5, pp. 1093-1099, 1996.

H. Konrad et al., "Nanostructured Cu-Bi Alloys Prepared by Co-Evaporation in a Continuous Gas Flow," NanoStructured Materials, vol. 7, No. 6, 1996, pp. 605-610.

Kenvin et al. "Supported Catalysts Prepared from Mononuclear Copper Complexes: Catalytic Properties", Journal of Catalysis, pp. 81-91, (1992).

J. Heberlein, "New Approaches in Thermal Plasma Technology", Pure Appl. Chem., vol. 74, No. 3, 2002, pp. 327-335.

M.Vardelle et al., "Experimental Investigation of Powder Vaporization in Thermal Plasma Jets," Plasma Chemistry and Plasma Processing, vol. 11, No. 2, Jun. 1991, pp. 185-201.

National Aeronautics and Space Administration, "Enthalpy", http://www.grc.nasa.gov/WWW/K-12/airplane/enthalpy.html, Nov. 23, 2009, 1 page.

P. Fauchais et al. "Plasma Spray: Study of the Coating Generation," Ceramics International, Elsevier, Amsterdam, NL, vol. 22, No. 4, Jan. 1996, pp. 295-303.

P. Fauchais et al., "Les Dépôts Par Plasma Thermique," Revue Generale De L'Electricitie, RGE. Paris, FR, No. 2, Jan. 1993, pp. 7-12.

P. Fauchais et al, "La Projection Par Plasma: Une Revue," Annales De Physique, vol. 14, No. 3, Jun. 1989, pp. 261-310.

(56) References Cited

OTHER PUBLICATIONS

T. Yoshida, "The Future of Thermal Plasma Processing for Coating", Pure & Appl. Chem., vol. 66, No. 6, 1994 pp. 1223-1230.

HA Net al., Deformation Mechanisms and Ductility of Nanostructured A1 Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.

Nagai, Yasutaka, et al., "Sintering Inhibition Mechanism of Platinum Supported on Ceria-based Oxide and Pt-oxide-support Interaction," Journal of Catalysis 24-2 (2006), pp. 103-109, Jul. 3, 2006, Elsevier.

Derwent English Abstract for publication No. SU 193241 A, Application No. 1973SU1943286 filed on Jul. 2, 1973, published on Mar. 1, 1976, entitled "Catalyst for Ammonia Synthesis Contains Oxides of Aluminum, Potassium, Calcium, Iron and Nickel Oxide for Increased Activity," 3 pgs.

Bateman, J. E. et al. (Dec. 17, 1998). "Alkylation of Porous Silicon by Direct Reaction with Alkenes and Alkynes," Angew. Chem Int. Ed. 37(19):2683-2685.

Carrot, G. et al. (Sep. 17, 2002). "Surface-Initiated Ring-Opening Polymerization: A Versatile Method for Nanoparticle Ordering," Macromolecules 35(22):8400-8404.

Chen, H.-S. et al. (Jul. 3, 2001). "On the Photoluminescence of Si Nanoparticles," Mater. Phys. Mech. 4:62-66.

Fojtik, A. et al. (Apr. 29, 1994). "Luminescent Colloidal Silicon Particles," Chemical Physics Letters 221:363-367.

Fojtik, A. (Jan. 13, 2006). "Surface Chemistry of Luminescent Colloidal Silicon Nanoparticles," J. Phys. Chem. B. 110(5):1994-1998.

Hua, F. et al. (Mar. 2006). "Organically Capped Silicon Nanoparticles With Blue Photoluminescence Prepared by Hydrosilylation Followed by Oxidation," Langmuir 22(9):4363-4370.

Jouet, R. J. et al. (Jan. 25, 2005). "Surface Passivation of Bare Aluminum Nanoparticles Using Perfluoroalkyl Carboxylic Acids," Chem. Mater.17(11):2987-2996.

Kim, N. Y. et al. (Mar. 5, 1997). "Thermal Derivatization of Porous Silicon with Alcohols," J. Am. Chem. Soc. 119(9):2297-2298.

Kwon, Y.-S. et al. (Apr. 30, 2003). "Passivation Process for Superfine Aluminum Powders Obtained by Electrical Explosion of Wires," Applied Surface Science 211:57-67.

Langner, A. et al. (Aug. 25, 2005). "Controlled Silicon Surface Functionalization by Alkene Hydrosilylation," J. Am. Chem. Soc. 127(37):12798-12799.

Li, D. et al. (Apr. 9, 2005). "Environmentally Responsive "Hairy"Nanoparticles: Mixed Homopolymer Brushes on Silica Nanoparticles Synthesized by Living Radical Polymerization Techniques," J. Am. Chem. Soc. 127(7):6248-6256.

Li, X. et al. (May 25, 2004). "Surface Functionalization of Silicon Nanoparticles Produced by Laser-Driven Pyrolysis of Silane Followed by HF-HNO3 Etching," Langmuir 20(11):4720-4727.

Liao, Y.-C. et al. (Jun. 27, 2006). "Self-Assembly of Organic Monolayers on Aerosolized Silicon Nanoparticles," J.Am. Chem. Soc. 128(28):9061-9065.

Liu, S.-M. et al. (Jan. 13, 2006). "Enhanced Photoluminescence from Si Nano-Organosols by Functionalization With Alkenes and Their Size Evolution," Chem. Mater. 18(3):637-642.

Neiner, D. (Aug. 5, 2006). "Low-Temperature Solution Route to Macroscopic Amounts of Hydrogen Terminated Silicon Nanoparticles," J. Am. Chem. Soc. 128:11016-11017.

Netzer, L. et al. (1983). "A New Approach to Construction of Artificial Monolayer Assemblies," J. Am. Chem. Soc. 105(3):674-676.

"Platinum Group Metals: Annual Review 1996" (Oct. 1997). Engineering and Mining Journal, p. 63.

Sailor, M. J. (1997). "Surface Chemistry of Luminescent Silicon Nanocrystallites," Adv. Mater. 9(10):783-793.

Stiles, A. B. (Jan. 1, 1987). "Manufacture of Carbon-Supported Metal Catalysts," in Catalyst Supports and Supported Catalysts, Butterworth Publishers, MA, pp. 125-132.

Subramanian, S. et al. (1991). "Structure and Activity of Composite Oxide Supported Platinum-Iridium Catalysts," Applied Catalysts 74: 65-81.

Tao, Y.-T. (May 1993). "Structural Comparison of Self-Assembled Monolayers of n-Alkanoic Acids on the surfaces of Silver, Copper, and Aluminum," J. Am. Chem. Soc. 115(10):4350-4358.

Zou, J. et al. (Jun. 4, 2004). "Solution Synthesis of Ultrastable Luminescent Siloxane-Coated Silicon Nanoparticles," Nano Letters 4(7):1181-1186.

U.S. Appl. No. 13/291,983, filed Nov. 8, 2011, for Layman et al.
U.S. Appl. No. 12/152,084, filed May 9, 2008, for Biberger.
U.S. Appl. No. 13/028,693, filed Feb. 16, 2011, for Biberger.
U.S. Appl. No. 12/943,909, filed Nov. 10, 2010, for Layman.
U.S. Appl. No. 12/152,111, filed May 9, 2008, for Biberger et al.
U.S. Appl. No. 12/151,830, filed May 8, 2008, for Biberger et al.
U.S. Appl. No. 12/968,248, filed Dec. 14, 2010, for Biberger.
U.S. Appl. No. 12/968,245, filed Dec. 14, 2010, for Biberger.
U.S. Appl. No. 12/968,241, filed Dec. 14, 2010, for Biberger.
U.S. Appl. No. 12/968,239, filed Dec. 14, 2010, for Biberger.
U.S. Appl. No. 12/969,128, filed Dec. 15, 2010, for Biberger.
U.S. Appl. No. 12/962,463, filed Dec. 7, 2010, for Leaman.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/968,253, filed Dec. 14, 2010, for Biberger.
U.S. Appl. No. 12/968,235, filed on Dec. 14, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/969,087, filed Dec. 15, 2010, for Biberger.
U.S. Appl. No. 12/962,533, filed Dec. 7, 2010, for Yin et al.
U.S. Appl. No. 12/001,643, filed Dec. 11, 2007, for Biberger et al.
U.S. Appl. No. 12/474,081, filed May 28, 2009, for Biberger et al.
U.S. Appl. No. 12/001,602, filed Dec. 11, 2007, for Biberger et al.
U.S. Appl. No. 12/001,644, filed Dec. 11, 2007, for Biberger et al.
U.S. Appl. No. 12/969,457, filed Nov. 15, 2010, for Leamon et al.
U.S. Appl. No. 12/969,503, filed Nov. 15, 2010, for Leamon et al.
U.S. Appl. No. 12/954,813, filed Nov. 26, 2010, for Biberger.
U.S. Appl. No. 12/954,822, filed Nov. 26, 2010, for Biberger.
U.S. Appl. No. 13/033,514, filed Feb. 23, 2011, for Biberger et al.
U.S. Appl. No. 13/589,024, filed Aug. 17, 2012, for Yin et al.
U.S. Appl. No. 13/801,726, filed Mar. 13, 2013, for Qi et al.

Babin, A. et al. (1985). "Solvents Used in the Arts," *Center for Safety in the Arts*: 16 pages.

Chen, W.-J. et al. (Mar. 18, 2008). "Functional $Fe_3O_4/TiO_2$ Core/Shell Magnetic Nanoparticles as Photokilling Agents for Pathogenic Bacteria," *Small* 4(4): 485-491.

Gangeri, M. et al. (2009). "Fe and Pt Carbon Nanotubes for the Electrocatalytic Conversion of Carbon Dioxide to Oxygenates," *Catalysis Today* 143: 57-63.

Luo, J. et al. (2008). "Core/Shell Nanoparticles as Electrocatalysts for Fuel Cell Reactions," *Advanced Materials* 20: 4342-4347.

Mignard, D. et al. (2003). "Methanol Synthesis from Flue-Gas $CO_2$ and Renewable Electricity: A Feasibility Study," *International Journal of Hydrogen Energy* 28: 455-464.

Park, H.-Y. et al. (May 30, 2007). "Fabrication of Magnetic Core@Shell Fe Oxide@Au Nanoparticles for Interfacial Bioactivity and Bio-Separation," *Langmuir* 23: 9050-9056.

Park, N.-G. et al. (Feb. 17, 2004). "Morphological and Photoelectrochemical Characterization of Core-Shell Nanoparticle Films for Dye-Sensitized Solar Cells: Zn-O Type Shell on $SnO_2$ and $TiO_2$ Cores," *Langmuir* 20: 4246-4253.

"Plasma Spray and Wire Flame Spray Product Group," located at http://www.processmaterials.com/spray.html, published by Process Materials, Inc., last accessed Aug. 5, 2013, 2 pages.

Ahmad, K. et al. (2008). "Hybrid Nanocomposites: A New Route Towards Tougher Alumina Ceramics," *Composites Science and Technology* 68: 1321-1327.

Chaim, R. et al. (2009). "Densification of Nanocrystalline Y2O3 Ceramic Powder by Spark Plasma Sintering," *Journal of European Ceramic Society* 29: 91-98.

Chau, J. K. H. et al. (2005). "Microwave Plasma Synthesis of Silver Nanopowders," *Materials Letters* 59: 905-908.

(56) References Cited

OTHER PUBLICATIONS

Das, N. et al. (2001). "Influence of the Metal Function in the "One-Pot" Synthesis of 4-Methyl2-Pentanone (Methyl Isobutyl Ketone) from Acetone Over Palladium Supported on Mg(Al)O Mixed Oxides Catalysts," *Catalysis Letters* 71(3-4): 181-185.

Lakis, R. E. et al. (1995). "Alumina-Supported Pt-Rh Catalysts: I. Microstructural Characterization," *Journal of Catalysis* 154: 261-275.

Schimpf, S. et al. (2002). "Supported Gold Nanoparticles: In-Depth Catalyst Characterization and Application in Hydrogenation and Oxidation Reactions," *Catalysis Today* 2592: 1-16.

Viswanathan, V. et al. (2006). "Challenges and Advances in Nanocomposite Processing Techniques," *Materials Science and Engineering* R 54: 121-285.

Wan, J. et al. (2005). "Spark Plasma Sintering of Silicon Nitride/Silicon Carbide Nanocomposites with Reduced Additive Amounts," *Scripta Materialia* 53: 663-667.

\* cited by examiner

FRACTURE TOUGHNESS OF GLASS

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention relates to the field of materials science. More particularly, the present invention relates to glass manufactures and a novel method of making

BACKGROUND

In many applications, glass is utilized because of the desired properties such as transparency and light transmission. Many household products are made of glass and glass has many decorative functions. Glass is also used widely in buildings and automobiles just to name a few more applications. Glass can be reinforced with some kind of particulate matter. Composite glass is desirable since in addition to their high hardness the composite can also possess a greater fracture toughness, which includes the ability to resist fracture. Present methods used to produce composite glass are costly, inefficient and complicated.

Accordingly, it is desirable to create an efficient and inexpensive method to produce glass having improve material characteristics, and especially fracture toughness.

SUMMARY OF THE INVENTION

Other features of the present invention will become apparent from consideration of the following description taken in conjunction with the accompanying drawings.

A first aspect of the present invention is for a method of making glass is provided. The method comprises preparing a dispersion of a nano-material. A slurry of a glass matrix material is prepared. The nano-dispersion is mixed with the matrix slurry to form a nano-dispersion/slurry mixture. In one embodiment, the mixing includes pouring the matrix slurry into the nano-dispersion while agitating. Alternative, the mixing includes pouring the nano-dispersion into the matrix slurry while agitating. The nano-dispersion/slurry mixture is dried. The nano-dispersion/slurry mixture is pressed into a final manufacture comprising a molecular structure including the nano-material bonded within and uniformly distributed throughout the molecular structure. The manufacture comprises an increased fracture toughness compared with a conventional manufacture produced without bonding the nano-material within the molecular structure.

The method includes providing the nano-material with a size on the order of tens of nanometers before the dispersion preparing step. A micron sized matrix material is provided on the order of several micrometers before the slurry preparing step. One percent of the nano-dispersion/slurry mixture comprises the nano-material dispersion. Alternatively, 0.5-10.0 percent of the nano-dispersion/slurry mixture comprises the nano-material dispersion. In yet another alternative, 0.5-20.0 percent of the nano-dispersion/slurry mixture comprises the nano-material dispersion. Sintering is performed on the final form using a sintering process following the pressing step. The sintering process includes a hot isostatic pressing process. The manufacture includes the nano-material bonded at triple points of the molecular structure. The drying of the nano-dispersion/slurry mixture includes a spray drying process.

Other features of the present invention will become apparent from consideration of the following description taken in conjunction with the accompanying drawings.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION

In the following description, numerous details and alternatives are set forth for the purpose of explanation. However, one of ordinary skill in the art will realize that the invention can be practiced without the use of these specific details. In other instances, well-known structures and devices are shown in block diagram form in order not to obscure the description of the invention with unnecessary detail.

Figure 1:
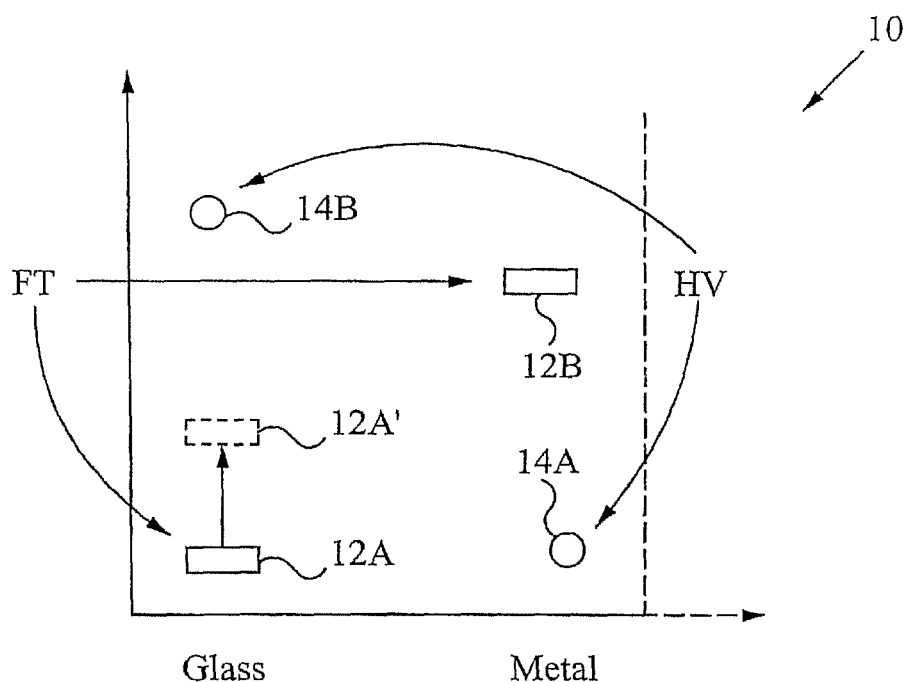
FIG. 1 illustrates a plot of fracture toughness of a glass compared with a metal in accordance with an embodiment of the invention.

Turning to FIG. 1, a plot 10 of fracture toughness of a glass compared with a metal is shown in accordance with an embodiment of the invention. Fracture toughness is a term in the field of material science that describes the characteristic of a material that has a crack to resist fracture. More specifically, fracture toughness describes a resistance of a material to a brittle fracture when a crack is present in the material. Brittle fracture occurs when the material exhibits no apparent plastic deformation prior to the fracture, in contrast to a ductile fracture, which is when the material exhibits extensive plastic deformation prior to the fracture. A glass will exhibit a low fracture toughness 12A while a metal will exhibit a significantly higher fracture toughness 12B. A novel method of the invention as described below produces a glass having an increased fracture toughness 12A'.

Hardness is a quality also shown in the plot of FIG. 1. Hardness is a term that describes the characteristic of a solid material to resist deformation. A metal will exhibit a low hardness 14A while a glass will exhibit a significantly higher hardness 14B.

Figure 2:
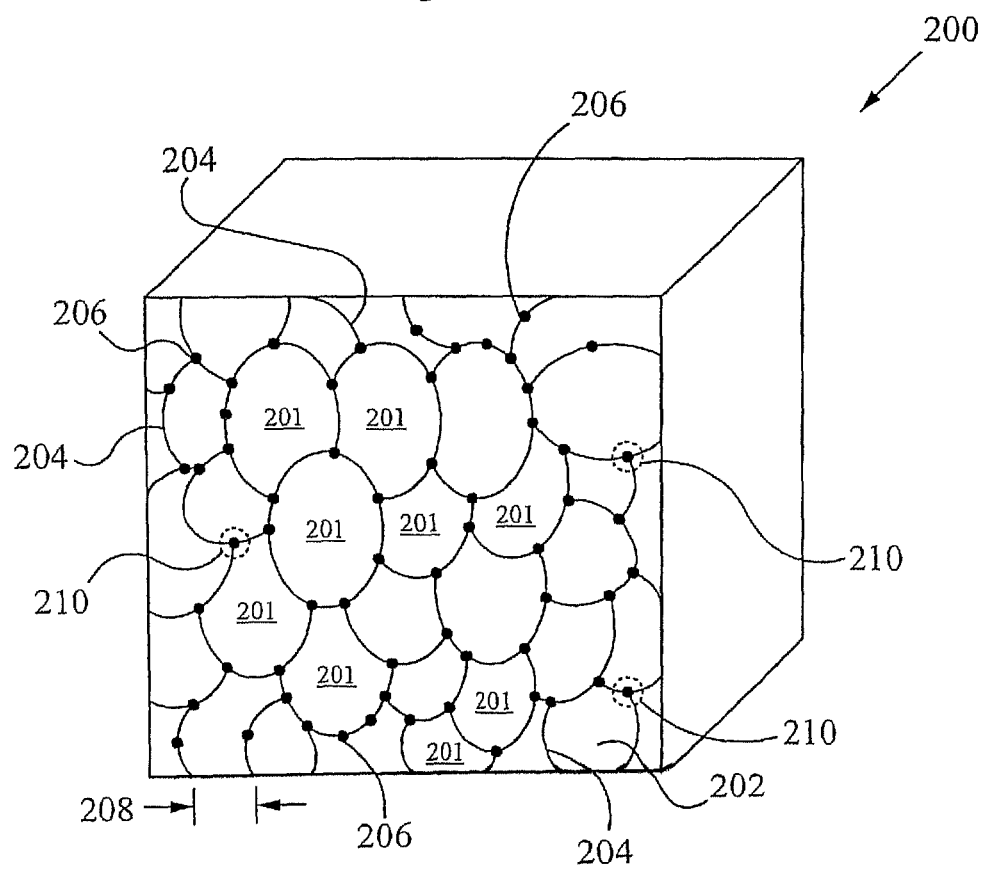
FIG. 2 illustrates a partial of a manufacture with improved fracture toughness in accordance with an embodiment of the invention.

Turning to FIG. 2, a partial of a manufacture 200 with improved fracture toughness is shown in accordance with an embodiment of the invention. The manufacture 200 comprises a composite of a glass matrix material 201 and nanoparticles or nano-material 206. The glass material 201 can comprise any a number of suitable glass materials depending on a particular application. In an exemplary embodiment the glass material 201 comprises a material from a group of silicon dioxide composites. A person of skill will appreciate the many possible oxides capable of combining with silicon dioxide to form the glass material. In one embodiment, the silicon dioxide composite can comprise silicon dioxide combined with a mixture of sodium carbonate, and either calcium carbonate or calcium oxide. In an alternative embodiment, the silicon dioxide composite can comprise silicon dioxide combined with boric oxide. In yet another embodiment, the silicon dioxide composite can comprise silicon dioxide combined with lead oxide.

Alternatively, the glass material 201 can comprise pure Silica or silicon dioxide (SiO2). In still another embodiment, the glass material can comprise a metallic glass. Examples of metallic glass alloys include alloys based on zirconium or palladium. The method as described in detail below produces the manufacture 200 in a final form that includes a "granular" or a molecular structure 204 having an amorphous disordered structure propagated throughout the manufacture 200. The molecular structure 204 comprises an average molecular boundary distance or diameter 208 of one to several micrometers. Preferably, the average molecular diameter 208 equals approximately one micrometer.

The nano-material 206 can comprise any a number of suitable materials that are non-miscible with the glass material 201 depending on a particular application. In an exemplary embodiment, the nano-material 206 can comprise a metallic material or a nano-metal. Examples of suitable metallic materials can include copper, silver and gold. A person of skill can appreciate that other metallic materials can also be suitable for the nano-material 206. Alternatively, the suitable metallic material can comprise a metallic compound. In an alternative embodiment, the nano-material 206 comprises a material from a group of non-oxide ceramics. Examples of suitable non-oxide ceramics can include titanium carbide or titanium diboride. In yet another embodiment, the nano-material 206 can comprise an oxide ceramic material that is non-miscible with the glass matrix material 201, for example, alumina and zirconia. A person of skill will appreciate an effect of the nano-material 206 on a refractive index and a transparent quality of the manufacture 200. Thus the nano-material 206 can be chosen such that refractive indexes of the nano-material 206 and the glass matrix material 201 are equal.

The novel method of the invention produces the manufacture 200 having nanoparticles 206 bonded within the molecular structure 204. The nanoparticles 206 are bonded within the molecular structure 204 of the glass material 201. A surface 202 of the manufacture 200 reveals that the nanoparticles 206 are substantially uniformly distributed throughout the molecular structure 204. Additionally, the manufacture 200 includes the nanoparticles 206 substantially uniformly distributed throughout a three dimensional mass of the manufacture 200. A novel result of the method includes the nanoparticles 206 substantially uniformly distributed where three or more interfaces intersect or at triple points 210 of the glass material 201. Preferably, the nanoparticles 206 comprise an average diameter suitable for bonding within the molecular structure 204 of the glass material 201. In an exemplary embodiment, the nanoparticles 206 have an average diameter of approximately 1 to 40 nm. Preferably, the average diameter of the nanoparticles 206 is 20 nm+/−10 nm.

Figure 3:
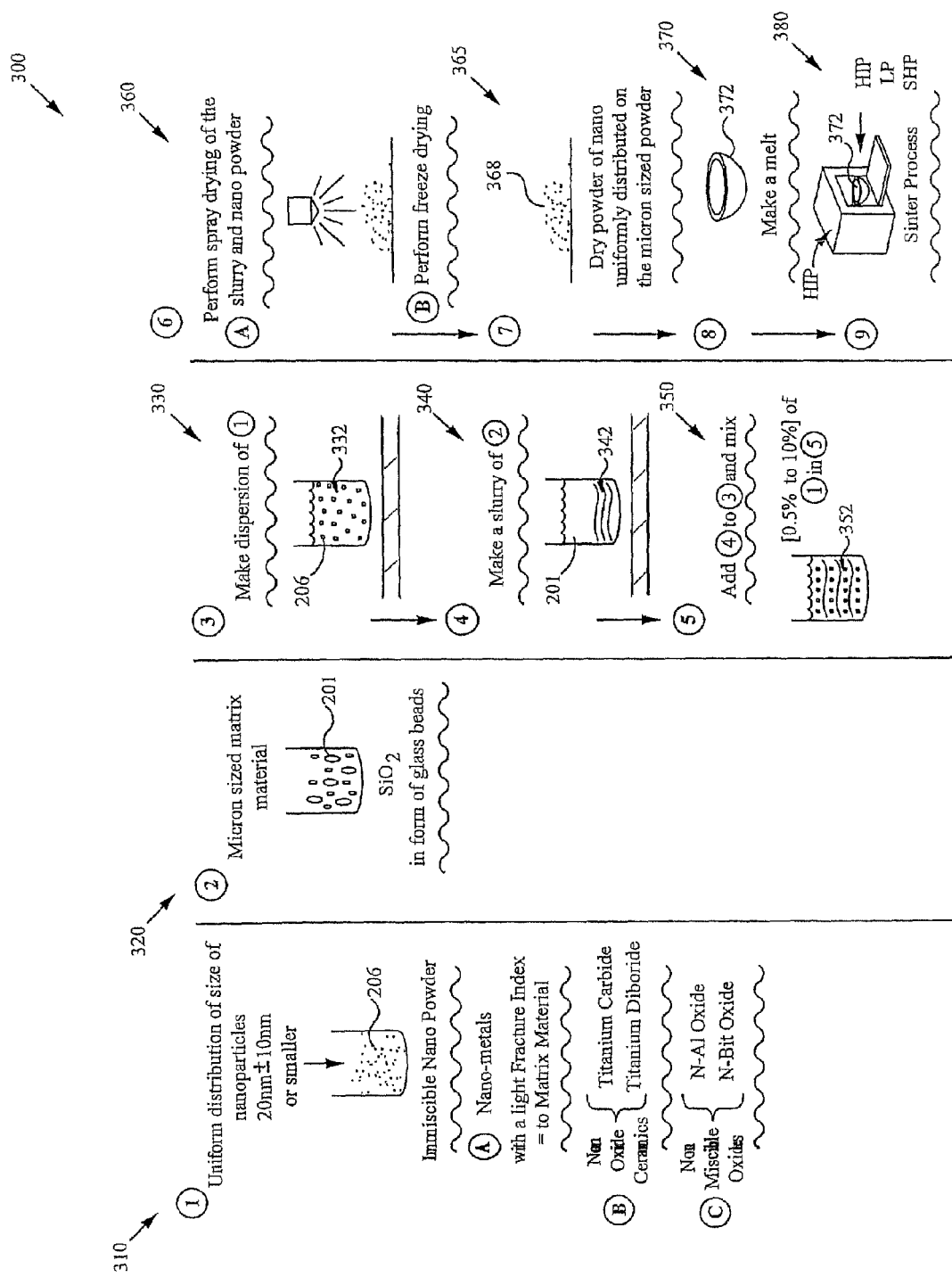
FIG. 3 illustrates a method of making a glass with improved fracture toughness in accordance with an embodiment of the invention.

Turning to FIG. 3, a method is shown for making a glass with improved fracture toughness in accordance with an embodiment of the invention. The method step 310 comprises providing a quantity of nanoparticles 206 which are suitable for bonding with glass material. The nanoparticles 206 preferably comprise an average diameter of 5-15 nm+/−4 nm. The nanoparticles 206 can be in the form of a powder. Any suitable method of providing the nanoparticles 206 known to a person of skill can be used. Such methods can include attrition of some kind. For example, ball milling or feeding micron sized material into a plasma process such as described and claimed in the co-owned and co-pending application Ser. No. 11/110, 341, filed Apr. 19, 2005, and titled "High Throughput Discovery of Materials Through Vapor Phase Synthesis," which is incorporated herein by reference. The method step 320 comprises providing a quantity of glass matrix material 201. The matrix material 201 comprises an average grain diameter of 500-600 nm. Alternatively, the matrix material 201 can comprise an average grain diameter of one micrometer. The matrix material 201 typically comprises a powered substance. The matrix material 201 can comprise a form of miniature beads or spheres.

The method step 330 comprises preparing a dispersion 332 of the nanoparticles 206 of the step 310. The dispersion 332 comprises a suspension of the nanoparticles 206 in a suitable liquid or suspension liquid. The nanoparticles 206 can comprise a nano-metal with an average diameter of 5-15 nm+/−4 nm. The nanoparticles 206 can comprise 0.5-20% of the dispersion 332. Alternatively, the nanoparticles 206 can comprise 0.5-10% of the dispersion 332. In another alternative, the nanoparticles 206 can comprise approximately 1.0% of the dispersion 332. In an exemplary embodiment, the suspension liquid comprises water and a surfactant. The surfactant can comprise ten percent of the suspension liquid. Any suitable surfactant can be used. Such surfactants are manufactured by Lubrizol Corporation. In an alternative embodiment, a wetting agent can also be included in the suspension liquid. The wetting agent can be five percent relative to water of the suspension liquid. Alternatively, the suspension liquid comprises an alcohol. Other liquids known to a person of skill can also be utilized. The dispersion 332 comprises a pH suitable for best mixing results with a slurry 342 of the step 340. In an exemplary embodiment, the pH of the dispersion 332 comprises a base. In another embodiment, the base pH comprises a 7.5 pH.

A feature of the method of the invention contemplates that the dispersion 332 comprises a substantially uniform distribution of the nanoparticles 206 within the liquid. The uniform dispersion 332 facilitates a uniform diameter of the nanoparticles 206 in the suspension and prevents a forming of large aggregations of the nanoparticles 206. A high concentration of large aggregations of nanoparticles 206 inhibit the desired uniform distribution of the nanoparticles 206 within the molecular structure 204 of the manufacture 200.

The method step 340 comprises preparing a slurry 342 of the glass matrix material 201 of the step 320. The slurry 342 preferably comprises a viscous suspension of the glass matrix material 201 in a suitable liquid. The glass matrix material 201 can comprise SiO2 with an average diameter of 500-600 nm. The glass matrix material 201 can comprise 50% of the slurry 342. In an exemplary embodiment, the suspension liquid comprises water. Other liquids known to a person of skill can also be utilized. The slurry 342 can include various additives or binders that facilitate a mixing, a drying, a melting and a sintering step described later below. The slurry 342 comprises a pH suitable for best mixing results with the dispersion 332. In an exemplary embodiment, the pH of the slurry 342 comprises a base. In one embodiment, the base pH comprises an 8.0-9.0 pH. In another embodiment, the base pH comprises an 11.0 pH.

The method step 350 comprises mixing the nano-dispersion 332 with the matrix slurry 342 to form a nano-dispersion/slurry mixture 352. The mixing of the nano-dispersion/slurry mixture 352 can comprise suitable agitation methods known to a person of skill. The mixing of the nano-dispersion/slurry mixture 352 produces a dispersion of the nanoparticles 206 within the matrix slurry so that the nanoparticles 206 are uniformly distributed throughout the nano-dispersion/slurry mixture 352. In an exemplary embodiment, the mixing comprises slowly pouring the slurry 342 into the dispersion 332. Preferably, the nano-dispersion/slurry mixture 352 is sonicated during the pouring of the slurry 342. A sonicating horn can be dipped in the dispersion 332 while pouring the slurry 342. A stir bar can optionally be placed in the dispersion 332 during the pouring of the slurry 342. The stir bar can be used to agitate the nano-dispersion/slurry mixture 352 while pouring the slurry 342. The percentage of the nano-dispersion/slurry mixture 352 that comprises the nano-dispersion 332 can vary between 0.5% to 20%. Alternatively, the nano-dispersion/slurry mixture 352 comprises 0.5% to 10% of the nano-dispersion 332. In another alternative, the nano-dispersion/slurry mixture 352 comprises 0.5% to 3.0% of the nano-dispersion 332.

In an alternative embodiment, the mixing comprises slowly pouring the dispersion 332 into the slurry 342. The nano-dispersion/slurry mixture 352 is sonicated during the pouring of the dispersion 332. A sonicating horn can be dipped in the slurry 342 while pouring the dispersion 332. A stir bar can be placed in the slurry 342 during the pouring of the dispersion 332. The stir bar can be used to agitate the nano-dispersion/slurry mixture 352 while pouring the dispersion 332. Other mixing techniques known to a person of skill the art can be substituted for the mixing and agitation described above.

In one embodiment, the various additives or binders that facilitate mixing, drying and sintering can be added to the slurry 342 before the mixing step of step 350. Alternatively, the additives or binders can be added to the nano-dispersion/slurry mixture 352 after the mixing step 350.

The method step 360 comprises drying the nano-dispersion/slurry mixture 352. In an exemplary embodiment, a spray drying process is utilized to dry the nano-dispersion/slurry mixture 352. The spray drying process comprises loading a spray gun and spraying the nano-dispersion/slurry mixture 352 into a closed compartment, for example, a glove box. The nano-dispersion/slurry mixture 352 is sprayed within the compartment and then allowed to dry. As the drying process proceeds, appreciable amounts of the liquid of the nano-dispersion/slurry mixture 352 evaporate to result in a powdered form or a premanufacture 368. In an alternative embodiment, the method step 360 comprises a freeze drying process. Freeze drying comprises placing the nano-dispersion/slurry mixture 352 into a freeze dryer and allowing the liquid of the nano-dispersion/slurry mixture 352 to evaporate until what results comprises the powdered form or the premanufacture 368.

The process step 365 comprises the premanufacture 368 which is the result of the drying step 360. The premanufacture 368 comprises the nanoparticles 206 uniformly distributed throughout the glass matrix material 201.

The method step 370 comprises a process to make the powdered premanufacture 368 a melt. Making the powdered premanufacture 368 a melt comprises placing the powdered premanufacture 368 of the method step 365 into a mold and pressing the powdered premanufacture 368 to form a molded premanufacture 372. Heat is also applied to the molded premanufacture 372 sufficient to liquify and integrate the nanoparticles 206 with the matrix material 201. A person of skill will choose any suitable method of heating the molded premanufacture 372 to cause liquidisation. The molded premanufacture 372 is allowed to cool.

The method step 380 comprises a process of sintering the molded premanufacture 372. The sintering process comprises using any of a variety of sintering processes. In an exemplary embodiment, the sintering process comprises a hot isostatic pressing (HIP) process. The hot isostatic pressing comprises placing the molded premanufacture 372 into a HIP furnace where the molded premanufacture 372 is heated under pressure. The HIP process facilitates a removal of porosity within the molded premanufacture 372. In an alternative embodiment, a liquid phase sintering process as practiced in the art can be used for the method step 380. In yet another embodiment, a simple hot pressing process as practiced in the art can be used.

Referring back to FIG. 2, a result of the method 300 comprises the manufacture 200 with improved fracture toughness in accordance with an embodiment of the invention. The manufacture 200 comprises a composite of a glass material 201 and nanoparticles or nano-material 206. The novel feature of the method 300 produces the manufacture 200 comprising the nanoparticles 206 uniformly distributed throughout the glass material 201.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of making glass comprising:
providing a plasma created nano-material with an average diameter of 1-15 nanometers;
preparing a dispersion of the nano-material;
preparing a slurry of a glass matrix material;
mixing the nano-dispersion with the matrix slurry to form a nano-dispersion/slurry mixture;
drying the nano-dispersion/slurry mixture; and
pressing the nano-dispersion/slurry mixture into a final manufacture comprising a molecular structure including the nano-material bonded within and uniformly distributed throughout the molecular structure.

2. The method of claim 1, wherein the mixing comprises pouring the slurry into the dispersion while agitating the nano-dispersion/slurry mixture.

3. The method of claim 1, wherein the mixing comprises pouring the dispersion into the slurry while agitating the nano-dispersion/slurry mixture.

4. The method of claim 1, further comprising providing a micron sized matrix material having an average grain size greater than or equal to 1 micrometer before the slurry preparing step.

5. The method of claim 1, wherein one percent of the nano-dispersion/slurry mixture comprises the nano-material dispersion.

6. The method of claim 1, wherein 0.5-10.0 percent of the nano-dispersion/slurry mixture comprises the nano-material dispersion.

7. The method of claim 1, wherein 0.5-20.0 percent of the nano-dispersion/slurry mixture comprises the nano-material dispersion.

8. The method of claim 1, further comprising sintering the final form using a sintering process following the pressing step.

9. The method of claim 8, wherein the sintering process comprises a hot isostatic pressing process.

10. The method of claim 1, wherein the manufacture includes the nano-material bonded at triple points of the molecular structure.

11. The method of claim 1, wherein the drying of the nano-dispersion/slurry mixture comprises a spray drying process.

12. The method of claim 1, wherein the drying of the nano-dispersion/slurry mixture comprises a freeze drying process.

13. The method of claim 1, wherein the nano-material comprises a non-oxide ceramic material.

14. The method of claim 1, wherein the nano-material comprises an oxide ceramic material that is nonmiscible with the glass matrix material.

15. A method of making glass comprising:
providing a plasma created metallic nano-material with an average diameter of 1-15 nanometers;
preparing a dispersion of the metallic nano-material;
preparing a slurry of a glass matrix material;
mixing the nano-dispersion with the matrix slurry to form a nano-dispersion/slurry mixture;
drying the nano-dispersion/slurry mixture; and
pressing the nano-dispersion/slurry mixture into a final manufacture comprising a molecular structure including the nano-material bonded within and uniformly distributed throughout the molecular structure.

16. The method of claim 15, wherein the mixing comprises pouring the slurry into the dispersion while agitating the nano-dispersion/slurry mixture.

17. The method of claim 15, wherein the mixing comprises pouring the dispersion into the slurry while agitating the nano-dispersion/slurry mixture.

18. The method of claim 15, further comprising providing a micron sized matrix material having an average grain size greater than or equal to 1 micrometer before the slurry preparing step.

19. The method of claim 15, wherein one percent of the nano-dispersion/slurry mixture comprises the nano-material dispersion.

20. The method of claim 15, wherein 0.5-10.0 percent of the nano-dispersion/slurry mixture comprises the nano-material dispersion.

21. The method of claim 15, wherein 0.5-20.0 percent of the nano-dispersion/slurry mixture comprises the nano-material dispersion.

22. The method of claim 15, further comprising sintering the final form using a sintering process following the pressing step.

23. The method of claim 22, wherein the sintering process comprises a hot isostatic pressing process.

24. The method of claim 15, wherein the manufacture includes the nano-material bonded at triple points of the molecular structure.

25. The method of claim 15, wherein the drying of the nano-dispersion/slurry mixture comprises a spray drying process.

26. The method of claim 15, wherein the drying of the nano-dispersion/slurry mixture comprises a freeze drying process.

* * * * *